US008245392B2

(12) United States Patent
Antesberger et al.

(10) Patent No.: US 8,245,392 B2
(45) Date of Patent: Aug. 21, 2012

(54) METHOD OF MAKING HIGH DENSITY INTERPOSER AND ELECTRONIC PACKAGE UTILIZING SAME

(75) Inventors: Timothy Antesberger, Vestal, NY (US); Frank D. Egitto, Binghamton, NY (US); Voya R. Markovich, Endwell, NY (US); William E. Wilson, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 468 days.

(21) Appl. No.: 12/592,734

(22) Filed: Dec. 1, 2009

(65) Prior Publication Data

US 2011/0126408 A1 Jun. 2, 2011

(51) Int. Cl.
*H05K 3/02* (2006.01)
*H05K 3/10* (2006.01)

(52) U.S. Cl. .............. 29/846; 29/830; 29/831; 29/832

(58) Field of Classification Search .......... 29/846, 29/827, 830–832, 840; 257/692, 697, 700, 257/773, E23.063, E23.173
See application file for complete search history.

(56) References Cited

U.S. PATENT DOCUMENTS

| | | | |
|---|---|---|---|
| 5,353,498 A | 10/1994 | Fillion et al. | |
| 5,527,741 A * | 6/1996 | Cole et al. | 438/107 |
| 5,528,159 A | 6/1996 | Carlton et al. | |
| 5,880,590 A | 3/1999 | Desai et al. | |
| 5,946,546 A | 8/1999 | Fillion et al. | |
| 6,156,484 A | 12/2000 | Bassous et al. | |
| 6,239,482 B1 | 5/2001 | Fillion et al. | |
| 6,239,980 B1 | 5/2001 | Fillion et al. | |
| 6,242,282 B1 | 6/2001 | Fillion et al. | |
| 6,333,563 B1 | 12/2001 | Jackson et al. | |
| 6,383,005 B2 | 5/2002 | Ho et al. | |
| 6,396,153 B2 | 5/2002 | Fillion et al. | |
| 6,516,513 B2 | 2/2003 | Milkovich et al. | |
| 6,529,022 B2 | 3/2003 | Pierce | |
| 6,816,385 B1 | 11/2004 | Alcoe | |
| 6,831,357 B2 * | 12/2004 | Nishitani et al. | 257/697 |
| 6,905,589 B2 | 6/2005 | Egitto et al. | |
| 7,292,055 B2 | 11/2007 | Egitto et al. | |
| 7,501,839 B2 | 3/2009 | Chan et al. | |
| 7,511,518 B2 | 3/2009 | Egitto et al. | |
| 2004/0171190 A1 * | 9/2004 | Nishitani et al. | 438/106 |

* cited by examiner

*Primary Examiner* — Thiem Phan
(74) *Attorney, Agent, or Firm* — Mark Levy; Hinman, Howard & Kattell, LLP; Lawrence R. Fraley

(57) ABSTRACT

A method of making an electronic package designed for interconnecting high density patterns of conductors of an electronic device (e.g., semiconductor chip) and less dense patterns of conductors of hosting circuitized substrates (e.g., chip carriers, PCBs). In one embodiment, the method includes bonding a chip to a single dielectric layer, forming a high density pattern of conductors on one surface of the layer, forming openings in the layer and then depositing metallurgy to form a desired circuit pattern which is then adapted for engaging and being electrically coupled to a corresponding pattern on yet another hosting substrate. According to another embodiment of the invention, an electronic package using a dual layered interposer is provided. Also provided are methods of making circuitized substrate assemblies using the electronic packages made using the invention's teachings.

20 Claims, 5 Drawing Sheets

METHOD OF MAKING HIGH DENSITY INTERPOSER AND ELECTRONIC PACKAGE UTILIZING SAME

CROSS-REFERENCE TO CO-PENDING APPLICATION

In Ser. No. 12/592,682, entitled "Electronic Package Including High Density Interposer And Circuitized Substrate Assembly Utilizing Same" (inventors: T. E. Antesberger et al), there is defined an electronic package for interconnecting a high density pattern of conductors of an electronic device (e.g., semiconductor chip) of the package and a less dense pattern of conductors on a circuitized substrate (e.g., PCB), the package including in one embodiment but a single, thin dielectric layer (e.g., Kapton) with a high density pattern of openings therein and a circuit pattern on an opposing surface which includes both a high density pattern of conductors and a less dense pattern of conductors.

TECHNICAL FIELD

This invention relates to methods of making electrically connecting interposer structures, and particularly to making such interposers capable of providing high density electrical interconnections between electronic components such as semiconductor chips and a host circuitized substrate such as a printed circuit board (hereinafter also referred to as a PCB), one example of such an interposer-chip(s) structure being a high density electronic package used in structures such as information handling systems (e.g., personal computers, servers, etc.). When utilized in such information handling systems, these packages in turn are typically mounted on and electrically coupled to the hosting larger substrate, the above-mentioned PCB. More particularly, the invention relates to making such interposer structures which are capable of providing what are also referred to in the art as high density interconnections (HDI), wherein such interconnections use a pattern of extremely small conductive elements such as solder balls or paste.

BACKGROUND OF THE INVENTION

Because miniaturization is a main objective of many of today's electronic component developers and manufacturers who design and produce semiconductor chips, methods of making such products have become relatively complex and, in some cases, relatively expensive. Today's chips, for example, contain many times the number of connections of chips of only a few years ago, and further miniaturization efforts are ongoing. Accordingly, manufacturers and developers of various electronic packages (e.g., chip carriers) and printed circuit boards (or cards) intended to accommodate same have been similarly pressed to provide effective methods to produce the interposers and other interconnecting structures to assure such higher density connections.

Today's semiconductor chips and the corresponding electronic package structures accommodating same utilize highly dense patterns of many (usually thousands) conductors. The package structure in turn must be relatively small to accommodate the foregoing miniaturization objectives, so it is understandable that making such small structures can be a manufacturing nightmare. Even a single misconnection may result in final product rejection. It is therefore essential that secure, effective connections be formed within the dielectric structures (e.g., substrate layers) through which such connections pass. That is, the greater the number of dielectric layers used, often the greater opportunity for error in circuit formation, especially of the inner vertical paths between various conductor patterns. And, if it is possible to form such effective circuit paths and patterns, there is still the potential for product failure due to improper connections between the formed patterns and the circuitized substrate (e.g., a PCB) designed to accommodate the final electronic package.

In some instances, the chosen small conductive elements to provide these connections are solder balls or small quantities of solder paste. Such solder balls may possess a diameter of only about three mils (0.003 inch) to about six mils (0.006 inch), and in the final product for incorporation within a larger electronic structure (e.g., a microprocessor), are typically arranged in compact, highly dense arrays (e.g., those with the solder balls positioned apart on only about six mil centers). The electrical circuitry for such packages is also highly dense, and may possess line widths as small as about two mils, with two mil spacing between lines. Even smaller elements are presently being contemplated for future products.

It is readily understood that methods of providing effective interconnections between such chips and interposers of electronic packages as well as between the packages and the corresponding host substrates (e.g., PCBs) are critical to the overall successful operation of the system accommodating same because the failure of even one interconnection may result in system failure, necessitating relatively extensive and expensive repairs to the system as well as a cessation in the functions being performed by the system or at least part thereof. Therefore, extreme care must be taken when producing the electronic package substrate member, as well as when aligning and electrically coupling the package and host PCB. The methodologies used to accomplish such interconnections and product formation must be precise.

Examples of methods of making substrates and substrate structures, some of which include electronic packages containing interposers of one type or another (often for chip testing), are illustrated in the following U.S. patents. The listing of these patents is not an admission that any are prior art to the invention claimed herein.

U.S. Pat. No. 7,511,518 for "Method Of Making An Interposer" granted Mar. 31, 2009 by Egitto et al describes a method of making an interposer in which at least two dielectric layers are bonded to each other to sandwich a plurality of conductors there-between. The conductors each electrically couple a respective pair of opposed electrical contacts which are formed within and protrude from openings which are also formed within the dielectric layers as part of this method. The resulting interposer is ideally suited for use as part of a test apparatus to interconnect highly dense patterns of solder ball contacts of a semiconductor chip to lesser dense arrays of contacts on the apparatus's printed circuit board.

U.S. Pat. No. 7,501,839 for "Interposer and Test Assembly For Testing Electronic Devices" granted Mar. 10, 2009 by Chan et al. describes a test apparatus which uses a pair of substrates and housing to interconnect a host substrate (e.g., PCB) to a semiconductor chip in order to accomplish testing of the chip. The apparatus includes a housing designed for being positioned on the PCB and have one of the substrates oriented therein during device engagement. The engaging contacts of the upper (second) substrate are sculpted to assure effective chip connection.

U.S. Pat. No. 7,292,055 for "Interposer For Use With Test Apparatus" granted Nov. 6, 2007 by Egitto et al. describes an interposer including at least two dielectric layers bonded to each other, sandwiching a plurality of conductors there-between. The conductors each electrically couple a respective pair of opposed electrical contacts formed within and protruding from openings with the dielectric layers.

U.S. Pat. No. 6,905,589 for "Circuitized Substrate and Method of Making Same" granted Jun. 14, 2005 by Egitto et al. describes a method of making a circuitized substrate in which an electrical common layer is used to form multiple, substantially vertically aligned conductive openings in a multilayered component such as a laminate interposer for coupling a chip to a PCB or the like. The structure, including such a chip and circuit board, is ideally suited for use within an information handling system.

U.S. Pat. No. 6,816,385 for "Compliant Laminate Connector" granted Nov. 9, 2004 by Alcoe describes a flexible shear-compliant laminate connector having a plurality of contacts formed on a first surface and second surface of the connector, wherein select contacts on the first surface of the connector are off-set from select contacts on the second surface of the connector. The laminate includes a core comprising copper-invar-copper (CIC), or other similarly used material, such as copper, stainless steel, nickel, iron, molybdenum, etc. The core has a thickness in the range of approximately 1-3 mils. The choice of core material depends upon the material within the chip package being attached thereto. For a ceramic chip package, having a relatively low CTE, the overall CTE of the laminate may be about midway between the card and the chip package. According to this patent, this provides improved distribution of stress, and therefore a reduction of stresses within the BGA connections and the interconnection.

U.S. Pat. No. 6,529,022 for "Wafer Testing Interposer for a Conventional Package" granted Mar. 4, 2003 by Pierce describes a wafer testing interposer. The interposer comprises a support having an upper and a lower surface. One or more solder bumps are on the lower surface. One or more first electrical terminals are on the upper surface, substantially corresponding to the position of the solder bumps, and forming a pattern. One or more first electrical pathways pass through the surface of the support and connect the solder bumps to the first electrical terminals. One or more second electrical terminals are on the upper surface of the support. The second electrical terminals are larger in size and pitch that the first electrical terminals, and these are located within the pattern formed by the first electrical terminals. One or more second electrical pathways connect the first electrical pathways to the second electrical pathways.

U.S. Pat. No. 6,516,513 for "Method of Making A CTE Compensated Chip Interposer" granted Feb. 11, 2003 by Milkovich et al. describes a multilayer CTE compensated chip interposer for connecting a semiconductor chip to a laminate chip carrier. A first dielectric layer, on the chip side of the interposer, is made of a stiff, high elastic modulus, material, such as a ceramic material, with a CTE closely matching the CTE of the chip. A second dielectric layer, on the laminate chip carrier side of the interposer, is made of resilient, low elastic modulus, material with metallurgy formed thereon, such as circuit board material, with a composite CTE closely matching the CTE of said chip carrier. A third dielectric intermediate layer, laminated between said first and second layers, is made of a low elastic modulus material with metallurgy formed thereon, such as a Teflon/glass particle material, with a composite CTE between the CTE's of said first and second layers.

U.S. Pat. No. 6,396,153 for "Circuit Chip Package And Fabrication Method" granted May 28, 2002 by Fillion et al. describes a semiconductor device including a semiconductor substrate, a lower interlayer film formed on an upper side thereof, an intermediate film formed on an upper side thereof, an upper interlayer film formed on an upper side thereof, and a lower plug made of an electrically conductive material that penetrates through the lower interlayer film and the intermediate film. However, the intermediate film has such a material quality that a ratio of an etching rate of the intermediate film to an etching rate of the upper interlayer film is sufficiently small to allow processing of the upper contact hole by etching the upper interlayer film using the intermediate film as a stopper under an etching condition for forming the upper contact hole. This patent further mentions using a polyetherimide adhesive.

U.S. Pat. No. 6,383,005 for "Integrated Circuit Socket With Contact Pad" granted May 7, 2002 by Ho et al. describes an integrated circuit socket having a contact pad. The integrated circuit socket includes a base unit, consisting of a base, contact pins and an elastomeric member. The contact pins provide electrical contact of the other elements and the elastomeric member provides the compactness of the assembly. The socket further includes an interposer, consisting of a flexible film, a stiffener and a stop layer wherein the contact pad of the flexible film may contact with the solder ball of the IC device to buffer the pressure formed by a tight contact when the IC device is moving downward. The socket also consists of an adapter unit and a cover.

U.S. Pat. No. 6,333,563 for "Electrical Interconnection Package And Method Thereof" granted Dec. 25, 2001 by Jackson et al. describes an electrical interconnection package and a method for using same which allegedly increases the fatigue life of a Ball Grid Array (BGA) electrical interconnection. Such BGAs include, understandably, solder balls, the term ball standing for solder ball. This structure includes an organic interposer using a high modulus under-fill material to couple an electronic "module." The organic interposer is then joined to a PCB using standard joining processes. The module can be removed from the organic board at any time by removing the organic interposer using standard rework techniques.

U.S. Pat. No. 6,242,282 for "Circuit Chip Package and Fabrication Method" granted Jun. 5, 2001 by Fillion et al. describes one method for packaging at least one circuit chip including: providing an interconnect layer including insulative material having a first side and a second side, initial metallization patterned on second side metallized portions of the second side and not on second side non-metallized portions of the second side, at least one substrate via extending from the first side to one of the second side metallized portions, and at least one chip via extending from the first side to one of the second side non-metallized portions; positioning the at least one circuit chip on the second side with at least one chip pad of the at least one circuit chip being aligned with the at least one chip via; and patterning connection metallization on selected portions of the first side of the interconnect layer and in the vias so as to extend to the at least one second side metallized portion and to the at least one chip pad. In related embodiments vias are pre-metallized and coupled to chip pads of the circuit chips by an electrically conductive binder. Thin film passive components and multilayer interconnections can additionally be incorporated into the package.

U.S. Pat. No. 6,239,980 for "Multimodule Interconnect Structure and Process" granted May 29, 2001 by Fillion et al. describes a circuit design logically partitioned into a plurality of blocks. As a first hierarchal assembly level, the blocks are fabricated as individual sub-modules each including at least one electronic component with component connection pads on a top surface, and a first interconnect structure including at least one interconnect layer bonded to the top surfaces, and interconnecting selected ones of the component connection pads. Sub-module connection pads are provided on upper surfaces of the sub-modules. As a second hierarchal assembly level, a second interconnect structure is bonded to the upper surfaces and interconnects selected ones of the sub-module connection pads.

U.S. Pat. No. 6,239,482 for "Integrated Circuit Package Including Window Frame" granted May 29, 2001 by Fillion et al. describes an integrated circuit package including at least one integrated circuit element (chip) coupled to a polymer film, a window frame coupled to the polymer film and surrounding the at least one integrated circuit element, and a quantity of encapsulating material positioned between the at least one integrated circuit element and the window frame.

U.S. Pat. No. 6,156,484 for "Gray Scale Etching For Thin Flexible Interposer" granted Dec. 5, 2000 by Bassous et al. describes a sculpted probe pad and a gray scale etching process for making arrays of such probe pads on a thin flexible interposer for testing the electrical integrity of microelectronic devices at terminal metallurgy. Also used in the etching process is a fixture for holding the substrate and a mask for single step photolithographic exposure. The result is an array of test probes of pre-selected uniform topography, which make contact at all points to be tested simultaneously and nondestructively. The pad is retained within a dielectric body and includes a "domed" portion and an opposing "sculpted" portion which is formed using etching, resulting in features having sculpted areas. Both portions are part of an integral structure, such that these are of a single metallic body and arranged in an opposing orientation with one portion being directly opposite the other.

U.S. Pat. No. 5,946,546 for "Chip Burn-In and Test Structure and Method" granted Aug. 31, 1999 by Fillion et al. describes a burn-in frame having at least one window and including resistors having resistor pads is situated on a flexible layer, and at least one integrated circuit chip having chip pads is situated in the at least one window. Via openings are formed in the flexible layer to extend to the chip pads and the resistor pads. A pattern of electrical conductors is applied over the flexible layer and extending into the vias. The at least one integrated circuit chip is burned in. The burn-in frame may further include fuses, frame contacts, and voltage bias tracks. After burning in the at least one integrated circuit chip, the chip pads can be electrically isolated and the at least one integrated circuit chip can be tested. This method can also be used to burn-in and test multichip modules.

U.S. Pat. No. 5,880,590 for "Apparatus and Method for Burn-In and Testing of Devices With Solder Bumps or Preforms" granted Mar. 9, 1999 by Desai et al. describes an apparatus for providing temporary connections to a flip-chip style chip having solder bumps or pre-forms protruding therefrom for testing and burn-in while avoiding distortion of the bumps or pre-forms and avoiding wear and damage to a test or burn-in jig such as a ball grid array. The apparatus uses a resilient bucketed interposer which includes recesses which have a depth greater than the protrusion of the solder bumps or pre-forms and, preferably are narrowed at one side to a teardrop shape. Metallization in the recesses and contacts on the interposer which mate with the jig are preferably textured with dendrites to be self-cleaning. A beveled tongue and groove arrangement translates a slight compressive force to a slight shearing force between the interposer and the chip to ensure good connections to the protruding solder bumps on the chip. Any deformation of the bumps thus tends to only improve accuracy of positioning of the bumps and avoids solder voiding due to compression distortion. Full burn-in and functional testing can then identify "known good" chips or dies before package completion, particularly to avoid rework of modular circuit packages.

U.S. Pat. No. 5,528,159 for "Method and Apparatus for Testing Integrated Circuit Chips" granted Jun. 18, 1996 by Charlton et al. describes a method and apparatus for testing semi-conductor chips. The apparatus is provided with an interposer that has contacts corresponding to the contacts on the semiconductor chip. Both the chip and the interposer contacts can be any known type including metal ball, bumps, or tabs or may be provided with dendritic surfaces. The chip contacts are first brought into relatively loose temporary contact with the contacts on the interposer and then a compressive force greater that 5 grams per chip contact is applied to the chip to force the chip contacts into good electrical contact with the interposer contacts. Testing of the chip is then performed. The tests may include heating of the chip as well as the application of signals to the chip contacts. After testing, the chip is removed from the substrate.

U.S. Pat. No. 5,353,498 for "Method for Fabricating an Integrated Circuit Module" granted Oct. 11, 1994 by Fillion et al. describes substrate material molded directly to semi-conductor chips and other electrical components that are positioned for integrated circuit module fabrication. Chips having contact pads are placed face down on a layer of adhesive supported by a base. A mold form is positioned around the chips. Substrate molding material is added within the mold form, and the substrate molding material is then hardened. A dielectric layer having vias aligned with predetermined ones of the contact pads and having an electrical conductor extending through the vias is situated on the hardened substrate molding material and the faces of the chips. A thermal plug may be affixed to the backside of a chip before substrate molding material is added. A connector frame may be placed on the adhesive layer before substrate molding material is added. A dielectric layer may be placed over the backsides of the chips before the substrate molding material is added to enhance repair. A portion of the chips and substrate molding material may be removed after the substrate molding material is hardened.

In addition to the foregoing, it is also imperative that if an interposer is utilized, it must be relatively thin, yet durable enough to provide the needed connections in various environments.

It is believed, therefore, that a method of making an interposer having the new and unique features defined herein, including a relatively small size to thus assure a correspondingly small electronic package utilizing same, will constitute a significant advancement in the art.

OBJECTS AND SUMMARY OF THE INVENTION

It is, therefore, a primary object of the present invention to enhance the interposer art and particularly that portion of the art dedicated to the manufacture of structures designed for interconnecting highly dense chip circuit patterns to corresponding patterns on a larger hosting substrate such as a printed circuit board.

According to one aspect of the invention, there is provided a method of making an interposer for interconnecting a high density pattern of conductors of an electronic device and a less dense pattern of conductors on a circuitized substrate, said method comprising providing a single, thin dielectric layer including first and second opposing surfaces, forming a high density pattern of conductors on said first surface of said single, thin dielectric layer adapted for engaging said high density pattern of conductors of said electronic device, forming a high density pattern of openings within said single, thin dielectric layer, each of said openings aligned with and exposing a respective one of said conductors of said high density pattern of conductors on said first surface and extending through said single, thin dielectric layer to said second opposing layer, forming a circuit pattern on said second opposing surface of said single, thin dielectric layer and including a first high density pattern of conductors similar to said high density pattern of conductors on said first surface and a second, less dense pattern of conductors adapted for being electrically coupled to said less dense pattern of conductors of said circuitized substrate, forming a plurality of circuit lines interconnecting selected ones of said conductors of said high density pattern of conductors on said second opposing surface to selected ones of said conductors of said less dense pattern of conductors, and forming a plurality of conductive members within said high density pattern of openings within said single, thin dielectric layer to electrically interconnect selected ones of said high density pattern of conductors on said first surface to selected ones of said high density pattern of conductors on said second opposing surface.

According to another aspect of the invention, there is provided a method of making an interposer for interconnecting a high density pattern of conductors of an electronic device and a less dense pattern of conductors on a circuitized substrate, said method comprising providing a first, thin dielectric layer including first and second opposing surfaces, forming a high density pattern of conductors on said first surface of said first, thin dielectric layer adapted for engaging said high density pattern of conductors of said electronic device, forming a high density pattern of openings within said first, thin dielectric layer, each of said openings aligned with and exposing a respective one of said conductors of said high density pattern of conductors on said first surface and extending through said first, thin dielectric layer to said second opposing layer, forming a circuit pattern on said second opposing surface of said first, thin dielectric layer and including a first high density pattern of conductors similar to said high density pattern of conductors on said first surface and a second, less dense pattern of conductors adapted for being electrically coupled to said less dense pattern of conductors of said circuitized substrate, forming a plurality of circuit lines interconnecting selected ones of said conductors of said high density pattern of conductors on said second opposing surface to selected ones of said conductors of said less dense pattern of conductors, forming a plurality of conductive members within said high density pattern of openings within said first, thin dielectric layer to electrically interconnect selected ones of said high density pattern of conductors on said first surface to selected ones of said high density pattern of conductors on said second opposing surface; bonding a second, thin dielectric layer to said second opposing surface of said first, thin dielectric layer so as to substantially cover said second, less dense pattern of conductors, forming a pattern of openings within said second, thin dielectric layer of a density substantially similar to said less dense pattern of conductors on said second opposing surface of said first, thin dielectric layer and extending through said second, thin dielectric layer to expose said less dense pattern of conductors on said second opposing surface, and forming a plurality of conductive members within said pattern of openings within said second, thin dielectric layer, said plurality of conductive members within said openings within said second, thin dielectric layer adapted for engaging said less dense pattern of conductors of said circuitized substrate to thereby interconnect said less dense pattern of conductors of said circuitized substrate to said less dense pattern of conductors on said second opposing surface of said first, thin dielectric layer.

According to still another aspect of the invention, there is provided a method of making an electronic package, said method comprising providing an electronic device including a high density pattern of conductors, providing a single, thin dielectric layer including first and second opposing surfaces, forming a high density pattern of conductors on said first surface of said single, thin dielectric layer adapted for engaging said high density pattern of conductors of said electronic device, electrically coupling said high density pattern of conductors on said first surface of said single, thin dielectric layer to said high density pattern of conductors of said electronic device, forming a high density pattern of openings within said single, thin dielectric layer, each of said openings aligned with and exposing a respective one of said conductors of said high density pattern of conductors on said first surface and extending through said single, thin dielectric layer to said second opposing layer, forming a circuit pattern on said second opposing surface of said single, thin dielectric layer and including a first high density pattern of conductors similar to said high density pattern of conductors on said first surface and a second, less dense pattern of conductors adapted for being electrically coupled to a less dense pattern of conductors of a circuitized substrate, forming a plurality of circuit lines interconnecting selected ones of said conductors of said high density pattern of conductors on said second opposing surface to selected ones of said conductors of said less dense pattern of conductors and forming a plurality of conductive members within said high density pattern of openings within said single, thin dielectric layer to electrically interconnect selected ones of said high density pattern of conductors on said first surface to selected ones of said high density pattern of conductors on said second opposing surface.

In accordance with yet another aspect of the invention, there is provided a method of making an electronic package, said method comprising providing an electronic device including a high density pattern of conductors, providing a first, thin dielectric layer including first and second opposing surfaces, forming a high density pattern of conductors on said first surface of said first, thin dielectric layer adapted for engaging said high density pattern of conductors of said electronic device, electrically coupling said high density pattern of conductors on said first surface of said first, thin dielectric layer to said high density pattern of conductors of said electronic device, forming a high density pattern of openings within said first, thin dielectric layer, each of said openings aligned with and exposing a respective one of said conductors of said high density pattern of conductors on said first surface and extending through said first, thin dielectric layer to said second opposing layer, forming a circuit pattern on said second opposing surface of said first, thin dielectric layer and including a first high density pattern of conductors similar to said high density pattern of conductors on said first surface and a second, less dense pattern of conductors adapted for being electrically coupled to a less dense pattern of conductors of a circuitized substrate, forming a plurality of circuit lines interconnecting selected ones of said conductors of said high density pattern of conductors on said second opposing surface to selected ones of said conductors of said less dense pattern of conductors, forming a plurality of conductive members within said high density pattern of openings within said first, thin dielectric layer to electrically interconnect selected ones of said high density pattern of conductors on said first surface to selected ones of said high density pattern of conductors on said second opposing surface, bonding a second, thin dielectric layer to said second opposing surface of said first, thin dielectric layer so as to substantially cover said second, less dense pattern of conductors, forming a pattern of openings within said second, thin dielectric layer of a density substantially similar to said less dense pattern of conductors on said second opposing surface of said first, thin dielectric layer and extending through said second, thin dielectric layer to expose said less dense pattern of conductors on said second opposing surface and forming a plurality of conductive members within said pattern of openings within said second, thin dielectric layer, said plurality of conductive members within said openings within said second, thin dielectric layer adapted for engaging said less dense pattern of conductors of said circuitized substrate to thereby interconnect said less dense pattern of conductors of said circuitized substrate to said less dense pattern of conductors on said second opposing surface of said first, thin dielectric layer.

BRIEF DESCRIPTION OF THE DRAWINGS

A complete understanding of the present invention may be obtained by reference to the accompanying drawings, when considered in conjunction with the subsequent, detailed description, in which:

FIGS. 1-3A are side elevational views, partly in section, and are an enlarged scale, illustrating the steps of making an interposer in accordance with one embodiment of the invention;

DETAILED DESCRIPTION OF THE PREFERRED EMBODIMENTS

Figure 1:
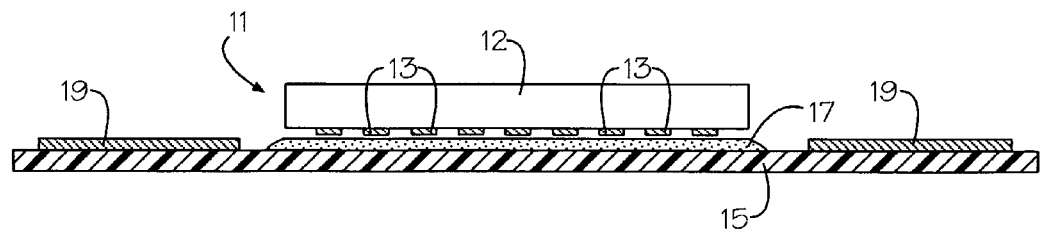

For a better understanding of the present invention, together with other and further objects, advantages and capabilities thereof, reference is made to the following disclosure and appended claims in connection with the above-described drawings. It is understood that like numerals will be used to indicate like elements from drawing figure to drawing figure.
Definitions The following are definitions of some of the more significant terms used in this Detailed Description.

By the term "circuitized substrate" as used herein is meant to include a substrate structure having at least one (in the case of the invention's interposer, perhaps two) and preferably more dielectric layer(s) and at least one (in the case of the invention's interposer, at least two) external conductive layer (s) positioned on the dielectric layer(s) and including a plurality of conductor pads as part thereof. The dielectric layer(s) may be made of one or more of the following dielectric materials: fiberglass-reinforced epoxy resin ("FR-4"), polytetrafluoroethylene (e.g., Teflon), including poytetrafluoroethylene filled with inorganic particles (e.g., silica) as a means of controlling the coefficient of thermal expansion of the dielectric material; polyimide (e.g., Kapton), polyamide, cyanate resin, photo-imageable material, and other like materials. One example of such material known today is sold under the product name "RO2800" by Rogers Corporation, Rogers, Conn. ("RO2800" is a trademark of the Rogers Corporation.) The conductive layer(s) preferably serve to conduct electrical signals, including those of the high frequency type, and is preferably comprised of suitable metals such as copper, but may include or comprise additional metals (e.g., nickel, aluminum, etc.) or alloys thereof.

By the term "circuitized substrate assembly" as used herein is meant to include a structure comprised of two or more circuitized substrates wherein one is the interposer of the invention and the other is a larger, hosting PCB, in addition to one or more semiconductor chips mounted on the invention's interposer. This assembly is capable of being successfully utilized in larger electrical assemblies such as information handling systems as defined herein-below.

By the term "electronic device" as used herein is meant an integrated circuit (IC) device (e.g., a semiconductor chip).

By the term "electronic package" as used herein is meant an interposer as taught herein having one or more IC's (e.g., semiconductor chips) positioned thereon and electrically coupled thereto. In a multi-chip electronic package, for example, a processor, a memory device and a logic chip may be utilized and oriented in a manner designed for minimizing the limitation of system operational speed caused by long connection paths. Some examples of such packages, including but a single chip or a plurality thereof, are also referred to in the art as chip carriers.

By the term "high density" as used herein to define the conductor patterns of the electronic devices, interposer, and circuitized substrates, as well as the pattern of openings within the invention's interposer dielectric layer(s), as defined herein, is meant patterns wherein the conductors each possess a maximum width within the range of from about 0.2 mils to about one mil and are spaced apart from each other at the nearest point of edges of adjacent conductors within the range of about 0.2 mils to about one mil. Accordingly, by the term "less dense" when referring to conductor patterns and patterns of openings herein is mean a pattern wherein the maximum widths and spaces immediately above are greater than those of said "high density" patterns when used in combination with said conductors or openings of higher density.

By the term "high speed" as used herein is meant signals of high frequency. Examples of such signal frequencies are attainable for the interposers taught herein and include those within the range of from about three to about ten gigabits per second (GPS). These examples are not meant to limit this invention, however, because frequencies outside this range, including those higher, may be attainable.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers, computer mainframes, etc.

By the term "interposer" as used herein is meant to include a structure capable of electrically interconnecting arrays of electrical contacts (conductors) found on electronic devices (e.g., semiconductor chips), and arrays of conductors found on larger, hosting substrates such as PCB's, using extremely small conductive elements such as very small solder balls, solder paste, or conductive paste quantities. This is not meant to limit the invention, however, as the interposers formed in accordance with the teachings herein may be used for other interconnecting means, including, e.g., as a circuitized substrate to form an interconnection between two corresponding circuitized substrates such as two PCBs wherein one may have a higher density pattern of conductors. Interposers as defined herein are also fully capable of providing successful interconnection between a plurality of chips when these are positioned on the interposer. Such an interposer, as defined herein, includes at least one dielectric layer and at least one conductive circuit layer wherein the layer includes a high density array of contact locations. Examples of dielectric materials include such materials as fiberglass-reinforced epoxy resins (some referred to as "FR-4" dielectric materials in the art), polytetrafluoroethylene (e.g., Teflon), including poytetrafluoroethylene filled with inorganic particles (e.g., silica) as a means of controlling the coefficient of thermal expansion of the dielectric material, polyimides (e.g., Kapton), polyamides, cyanate resins, polyphenylene ether resins, liquid crystal polymers, photo-imageable materials, and other like materials. If the dielectric materials for the interposer are of a photo-imageable material, this material may be photo-imaged (or photo-patterned), and developed to reveal the desired pattern of openings. The dielectric material may be curtain-coated, spin-coated or screen-applied, or it may be supplied as dry film.

By the term "Kapton" as used herein is meant a polyimide material currently available from E.I. duPont deNemours & Company of Wilmington, Del., and sold under this product name.

By the term "thin" as used herein to define a dielectric layer for use in the interposer of the invention is meant a thickness within the range of from only about 0.5 mils to about three mils.

Other definitions are readily ascertainable from the detailed descriptions provided herein.

In FIG. 1, there is shown an electronic device in the form of a semiconductor chip or die 11 of standard configuration, this chip to be bonded to an interposer (defined below) to produce an electronic package in accordance with one embodiment of this invention. As such, chip 11 includes a wafer body portion 12 and a high density pattern of conductors 13 on a lower surface of the wafer body portion. Conductors 13, which may number as many as about 10,000, may be of aluminum or similar highly conductive material, and are spaced apart only about 8.0 mils from one another.

Also shown in FIG. 1 is a thin dielectric layer 15 preferably comprised of one of the afore-mentioned dielectric materials used in circuitized substrate manufacturing processes and resulting products, layer 15 forming part of an interposer onto which chip 11 is to be positioned and electrically coupled in accordance with the teachings of this invention. In a more preferred embodiment, layer 15 is comprised of the polyimide Kapton, available from E. I. du Pont de Nemours & Company (hereinafter du Pont). A more preferred Kapton for layer 15 is du Pont's Kapton E general-purpose film, which may be used at temperatures as low as −269 degrees Celsius (C.) and as high as 400 degrees C. This particular Kapton can be laminated, metallized, punched, formed or adhesive coated, all in accordance with known processes. Other Kaptons from du Pont's wide selection are also possible for layer 15. Layer 15 in the embodiment shown in FIG. 1 is only from about 0.5 mils to about 3 mils thick, illustrating the extremely thin nature of this part of the invention.

As part of the invention's method, chip 11 is placed "face down" i.e., conductors 13 down) on layer 15, which has previously been coated with a layer of curable adhesive 17. In this regard, practically any coating process used to apply thin films from liquids may be utilized, such as draw down bar, slot coating, screening, spin coating, etc. Adhesive 17 is preferably a polyetherimide adhesive, such adhesives being known in the art. In one embodiment, the adhesive layer has a thickness of only about 0.5 mils. Other curable adhesives are possible and the invention is not limited to this particular material. As stated, adhesive 17 is not yet fully cured at this point.

Layer 15 may also include conductive pads 19 or other circuit members, including circuit lines, formed on the upper surface thereof, such pads 19 shown in FIG. 1. Such pads (and members) 9 are shown in FIG. 1 only, but may be retained on layer 15 in the other FIGS. herein if needed. These are not shown in the subsequent FIGS, however, for ease of illustration. Such metallic structures may be formed using conventional circuit-forming processes used in PCB manufacture and may be used to provide added rigidity to layer 15 to thereby enhance placement thereof as well as added further processing. Following same, removal of pads 19 is possible and, if desired, may be achieved using conventional printed circuit board masking and etching processing steps. Additional description is thus not considered necessary.

Figure 2:
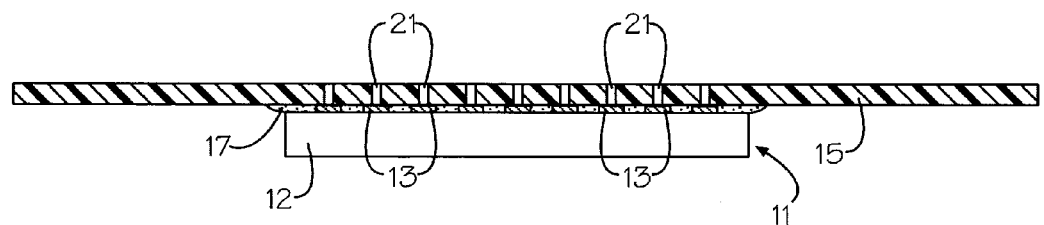

Chip 11 is forced down onto the adhesive 17 using a conventional component placement apparatus. Subsequent heating of the now positioned chip and layer 15 may now occur, in one example to a temperature within the range of about 150 degrees C. to about 250 degrees C. The result of such heat application is a final, full cure of the adhesive and thus a secured bond between chip 11 and layer 15. This bonded chip-layer structure, now the initial elements of an electronic package, is shown in FIG. 2, albeit the chip is now inverted. Significantly, no material other than adhesive 17 is used to complete a solid bond between these two elements.

It is also understood that adhesive 17 may be applied on the undersurface of chip 11, rather than on the upper surface of layer 15 as shown, in which case it would be of similar thickness as the layer shown above. It is also within the scope of this invention to provide two thin layers of adhesive, one on the undersurface of chip 11 and the other on the upper surface of layer 15, in which case each would have a similar thickness approximately one-half that of a single layer of adhesive. It is also within the scope of this invention to provide for adhesive coverage across the entire surface of layer 15 to which the chip, or plurality of chips if utilized, are bonded, including the area over pads 19 if these pads are present. In all of these alternative possibilities, the coating procedure defined above to apply adhesive 17 to layer 15 may be used.

In FIG. 2, the FIG. 1 structure, following completion of the bonding operation, is now inverted, with chip 11 facing "up" for further work on the structure. In this orientation, a laser (not shown) is used to ablate the dielectric material of the layer 15 to form a high density pattern of openings 21 in the layer which extend entirely through the layer's thickness to expose the underlying chip conductors 13. In one embodiment, a frequency-tripled Nd-YAG laser operating at the third harmonic is used and provides energy at wavelengths about 355 nanometers (nm) to provide all of the needed openings. A plasma cleaning step is now utilized to remove any residue from the newly formed openings 21. A known plasma cleaning operation may be performed for this step.

Figure 3A:
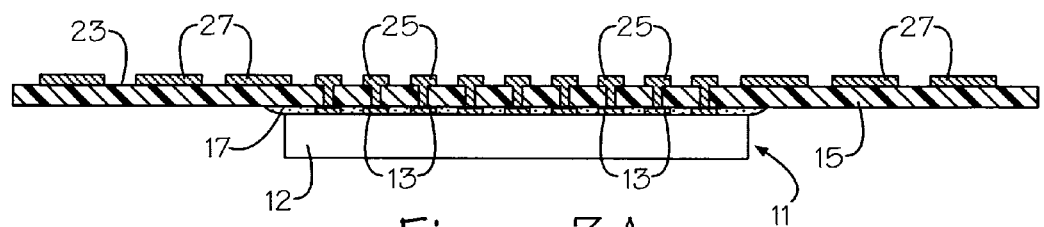
Figure 3B:
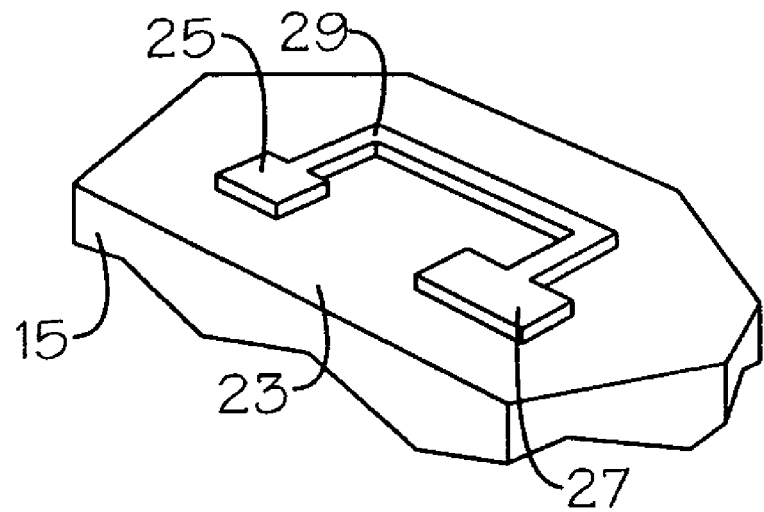
FIG. 3B is a partial perspective view, on an enlarged scale over FIGS. 1-3A, showing a representative conductor from the high density pattern of conductors on the first dielectric layer, a representative conductor from the less dense pattern of conductors relative to the high density pattern, and a representative circuit line formed on the layer for connecting the two, all made using the teachings of this invention.

Following plasma cleaning, a circuit pattern is now formed on the opposing, second surface 23 of layer 15, this step being shown in FIG. 3. Specifically, a "seed" metal layer (not shown) is sputter deposited onto the surface 23 and, significantly, onto the interior walls of each of the openings 21. In one example, the seed layer may be comprised of copper, but other known seed metallurgies are also acceptable. Sputter deposition of seed layers to subsequently form final substrate circuit patterns is known in the art and further description is not considered necessary. Seeding is known in the industry in order to promote better adhesion of the final layers of metal to be deposited. Comparing FIGS. 3A, 3B and 4, the circuit pattern is better understood.

Following seeding, a high density pattern of conductors 25 is formed on surface 23 substantially directly opposite the portion of the undersurface of layer 15 to which chip 11 is bonded, as shown in FIG. 3A. This is achieved using electroplating, depositing a copper layer over the earlier provided seeded locations. In one example, a total thickness of 0.5 mils of copper is provided, including within the openings 21 which, as stated, included seed layers on the internal walls thereof. Either subtractive or additive plating may be used, a preferred plating metallurgy being copper. The resulting conductors form part of circuit pattern on layer 15, which, as shown, extends substantially across the full surface 23. A less dense (than high density pattern of conductors 25) pattern of conductors 27 is also formed as part of the pattern.

To complete the circuit pattern, selected ones of the high density conductors 25 are coupled to selected ones of the less density conductors 27, a preferred means of connection being individual circuit lines 29 (FIG. 3B). The full configuration for the invention's circuit pattern is not shown for ease of description, but it is understood to include a plurality of the high density conductors 25 and a corresponding number (plurality) of the less density conductors 27, with selected couplings between the different conductors being provided. In other words, a full circuit pattern of both types of conductors and interconnecting lines is formed. In one example, each of the high density conductors have a width of from about 0.2 mils to about 1.0 mil, the less density conductors a width of about 1.6 mils to about 3.2 mils, and each of the connecting lines a width intermediate that of the high density and less density conductors. All conductors and connections of the circuit pattern are preferably formed in one process, and not individually.

Figure 4:
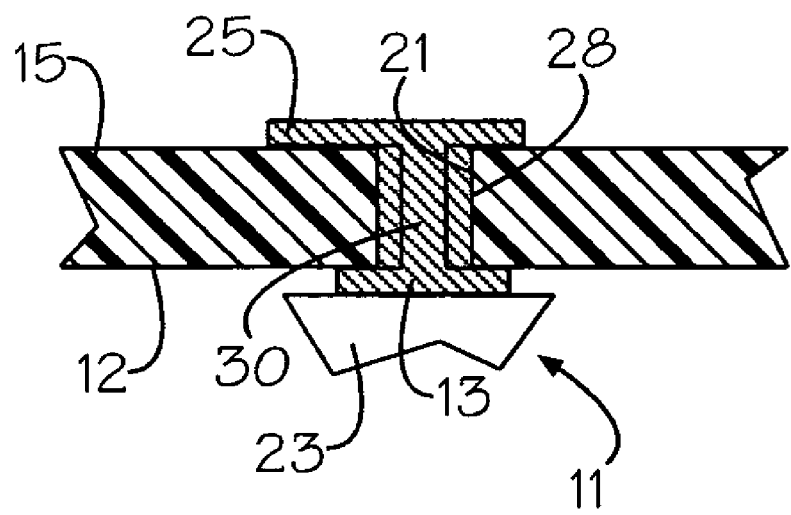
FIG. 4 is a partial, side elevational view, in section and on a much enlarged scale over the scale of FIGS. 1-3, illustrating in greater detail one of the openings formed in a dielectric layer of the invention's interpose using the invention's teachings, with conductive means also formed according to one embodiment of the invention to interconnect the opposing conductor patterns on the dielectric layer.

The partial, much enlarged view in FIG. 4 more clearly illustrates one example of the plating of one of the openings 21. Each opening includes a layer 28 of a first metallurgy on the interior walls over which is the metallurgy used to form the high density conductors 25 (and less dense conductors 27 and connecting lines 29, if formed simultaneously, as desired). Region 30 of the opening may be devoid of copper, or filled with copper during the defined plating process. This latter embodiment (filled opening) is not required to assure a good connection through layer 15 at these locations. This plating process also provides a corresponding conductor 25 on the opposite surface of layer 15 from conductor 13 of chip 11.

The structure of FIG. 3A thus represents the simplest form of the electronic package made in accordance with one embodiment of the invention's teachings: only a single dielectric layered interposer is utilized. This electronic package in such relatively simple form is now adapted for being positioned on and electrically coupled to a circuitized substrate using the teachings herein, such a hosting substrate being a PCB, chip carrier or the like. The package of FIG. 3A is thus understood to be very thin in overall thickness, yet fully capable of assuring effective couplings between the chip and the desired host substrate on which the package is positioned. Suitable mechanical supporting structure (not shown) is used to retain the layer in a near horizontal and rigid orientation during positioning over a host substrate, such structure known in the art (e.g., similar to that used to couple chips onto substrates) and further description is not considered necessary.

In one example, the patterns of conductors 25 and 27 may be coupled using conventional electronic paste, or, preferably, solder balls or solder paste of conventional compositions. Significantly, the connections formed with the host substrate are those of a less dense pattern such that high density patterns of conductors are not necessary for such a host substrate. This assures a relatively lower cost host substrate than would be otherwise required if a one-to-one chip-host conductor connection scheme were mandated. It should also be emphasized that the single layered package of FIG. 3A does enable such high density connections, if the hosting substrate does indeed include a corresponding high density pattern of conductors. Minute solder balls or paste could be used in such a situation, these being located simply between the mating high density patterns. Thus it is possible with the single layered package of FIG. 3A to form both high density and less dense connections with a host substrate or to simply provide less costly and less complex less dense connections. The unique invention of FIG. 3A is thus adaptable to both versions.

While a single layered interposer package may be produced using the teachings herein, it is possible, and perhaps preferred in some instances, to add a second dielectric layer and conductors to form a dual layered (dielectric) interposer package structure, or even to add yet further dielectric-conductive layer elements. While this will produce a thicker and thus more rigid structure than the single layered FIG. 3A version, it is also understood that the addition of more layers, and the necessary added connections therein, adds to the complexity of making such a structure, as well as the final cost thereof. Further, adding more layers and more connections also increases the opportunity for failure in the final structure. It has been determined that with respect to the instant invention, however, it is possible to add a second layer and not overly complicate the final structure or adversely affect the resulting added connection formations. This represents yet another significant aspect of this invention.

Figure 5:
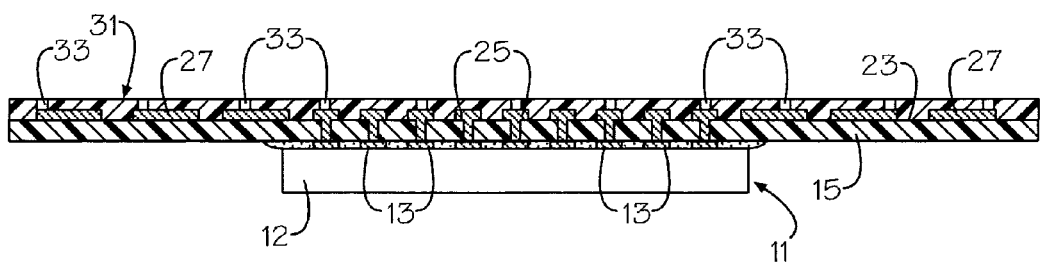
FIGS. 5 and 6 are side elevational views, partly in section, and on a similar scale as FIGS. 1-3, illustrating the added steps from FIGS. 1-3 for making an alternative embodiment of the invention's interposer wherein two dielectric layers are utilized.

In FIG. 5, a second dielectric layer 31 is applied to the second opposing side 23 of layer 15, this second layer preferably of the same material as layer 15 and of a similar thickness. This is not limiting of the invention, however, because other dielectric materials and thicknesses are possible. Layer 31 is also shown to cover all of the conductors (both conductors 25 and 27) on surface 23 as well as connecting lines (29). It is within the scope of the invention to use a conventional lamination process used in bonding dielectric layers of chip carrier substrates, PCBs and other circuitized substrate products for this second layer application, or to use a conventional spin coating process to apply a liquid polymer which can subsequently be cured at elevated temperatures.

Layer 31 may also be bonded to layer 15 using a similar adhesive and process used to bond chip 11 to the opposite side of layer 15. More specifically, a thin layer of adhesive (not shown in FIGS. 5 and 6 for ease of illustration) is placed on the undersurface (that facing layer 15) of layer 31 and the second layer then bonded using a combination of heat and pressure. The heat and pressure application may result in final cure of the adhesive as occurred above. It is also possible to place the adhesive on the upper surface 23 of layer 15, or to provide extremely thin layers on each of the facing surfaces. Regardless of which process is used, it is understood that proper mechanical support structure, including the same as used when bonding chip 11 onto layer 15, may be used during said process. Such mechanical supporting structure is within the scope of one of ordinary skill in this art and further description is not considered necessary at this time.

If an adhesive is used, the second layer 31 is pressed downwardly onto the adhesive using vacuum pressure of about 40 pounds per square inch (psi) at a temperature within the range of about 80 degrees C. to about 190 degrees C. If a conventional lamination process is used, layer 31 may be pressed downwardly onto the first layer using a lamination pressure of about 200 to about 400 psi at a temperature within the range of about 185 degrees C. to about 200 degrees C.

With second layer 31 firmly bonded to layer 15, the second layer is now subjected to a similar laser ablation process as used for layer 15, this time to form a new plurality of openings 33 within layer 31, each sufficiently able to expose a corresponding one of the high density conductors 25, and, significantly, also the less dense conductors 27 on the outer portion of layer 15. In one example, each opening 33 may have a diameter of only about one mil, similar to those in layer 15. Following laser ablation, a second plasma cleaning procedure is performed to remove undesirable polymer material from within the holes. Layer 31 is now ready for metallization.

Figure 6:
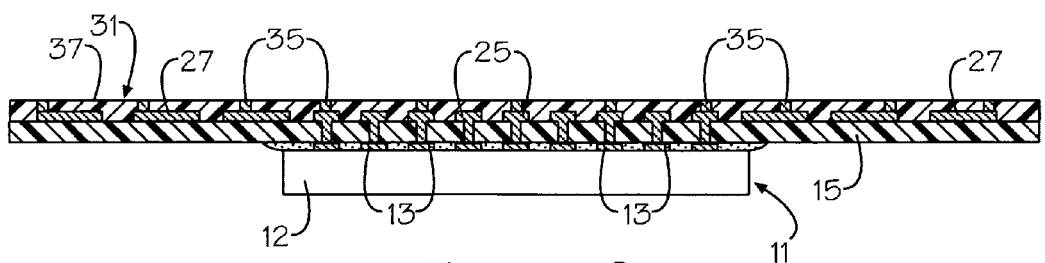

In FIG. 6, a metallization process involving initial application of a seed layer followed by deposition of a thicker copper layer, both similar to that used for layer 15, is now performed to coat each opening 33 with metal conductors 35 each of excellent electrical conductivity. The metal conductors 35 are shown as filling the entire opening 33 in FIG. 6. Each conductor 35 is in turn directly connected (bonded) to a respective conductor 25 or 27, as seen in FIG. 6 and as described above. Not all conductors 25 are connected.

The dual layered interposer-chip package of FIG. 6 differs from the single layered embodiment of FIG. 3A, as understood, in at least two ways: (1) all of the conductors 35 occupy a low density pattern, compared to the high and less dense patterns of conductors 25 and 27, respectively, in FIG. 3A; and (2) the exposed portions of conductors 35 are those end segments substantially planar with the upper surface 37 of the now outermost layer 31. That is, there is no need for additional external conductors on surface 37 for this dual layered interposer embodiment of the invention's electronic package. However, should it be desirable to do so, such external conductors may be formed, using an almost identical process as that used to form conductors 25 and 27 (and lines 29) as well as to fill the openings within the first layer 15. In addition, as for the processes used to form conductors 25 and 27 (and lines 29) as well as to fill the openings within the first layer 15, these openings may be coated with a conductive material such that the hole is not completely filled, but rather the conductive material coats only the base of the opening and the internal walls thereof.

Figure 7:
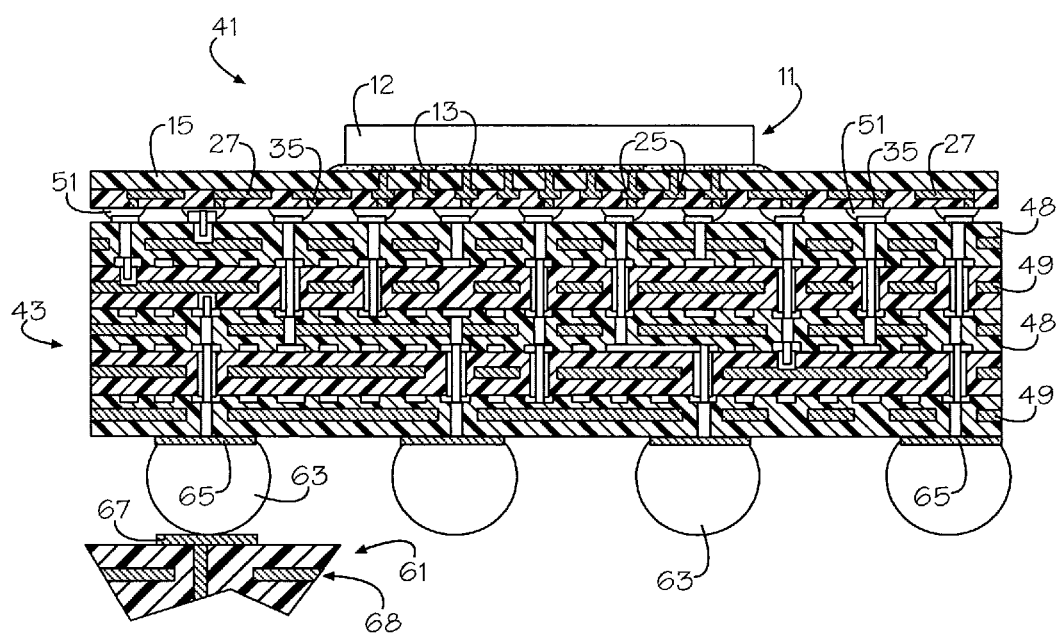
FIG. 7 is a side elevational view, on a reduced scale over FIGS. 1-3, illustrating a circuitized substrate assembly which may be formed in accordance with the teachings herein, the assembly of FIG. 7 utilizing an interposer similar to that formed using the steps of FIGS. 1-3, 5 and 6.

In FIG. 7, a circuitized substrate assembly 41 is shown according to one embodiment of the invention, made using the teachings herein. Specifically, the assembly of FIG. 7 includes as a key part thereof the electronic package formed as defined and shown in FIGS. 1-3A, 5 and 6. This electronic package thus includes both a chip and dual layered interposer bonded thereto. This package is positioned on and electrically coupled to a supporting, thicker circuitized substrate assembly 43, preferably using solder balls or solder paste, or possibly, conductive adhesive. These latter bonding elements are represented by the numeral 51 in FIG. 7.

Positioning of the package may be accomplished using conventional pick-and-place equipment used in chip and other component placement on hosting substrates such as PCBs. The exposed conductors 35 of lower layer 31 may include one of the solder balls or solder or conductive paste quantities thereon prior to such positioning and coupling, following which placement a heating operation is performed. In the case of solder, a solder reflow procedure completes the conductor 35 to underlying conductor bonds. Such underlying hosting conductors may be copper or other metal conductors formed on the top surface of hosting substrate 43, as are conventionally provided in many known PCB manufacturing processes.

Substrate 43 preferably includes a plurality of alternative dielectric and conductive layers as is known in PCB and related substrate manufacturing. A well known substrate 43 for use with the invention is sold under the product name HyperBGA by the assignee of this invention, Endicott Interconnect Technologies, Inc. (HyperBGA is a trademark of Endicott Interconnect Technologies, Inc.) Such products may include many different combinations of layer formats, as well as interconnections such as plated-through-holes (PTHs), pin-in-hole elements, etc. and further definition is not considered necessary. The invention is thus not limited to the substrate 43 configuration illustrated in FIG. 7.

As further seen in FIG. 7, assembly 41 may now be positioned on and electrically coupled to yet another substrate 61 (only partially shown in FIG. 7), one possible means for accomplishing this being to use solder balls 63 to interconnect external conductors 65 of the assembly to corresponding conductors 67 on the hosting substrate 61. One example of such a substrate is a larger PCB, preferably having more conductive layers and thus more functioning capacity than thinner, smaller substrates. In one example, as many as about 10,000 connections between substrate 43 and host 61 may be formed. The pattern of such connections is shown to be much less dense than the patterns of conductors 25 and 27, and those of similar density to couple the package's layer 31 onto substrate 43. Thus, it is not essential to use complex alignment and bonding apparatus at this stage of the formation of the final assembly, yet another cost savings provided by the invention. The assembly of FIG. 7 may now be used as part of a larger system such as an information handling system as defined hereinabove.

If solder balls or paste are used for interconnections between substrate 43 and host substrate 61, as well as between substrate 43 and the electronic package, it is preferable to use solder compositions having different melting points. Specifically, those used to couple the package (interposer-chip) to substrate 43 preferably have a higher melting point than those designed to couple substrate 43 and host 61. It is thus assured that the re-flowed solders between the interposer and substrate 43 will retain their re-flowed shape and connection during the subsequent re-flow operation designed to re-flow solder balls 63. This feature thus assures retention of sound connections in a highly dense connection scheme while allowing further, relatively harsh processing involving relatively high temperatures.

Although the assembly of FIG. 7 is shown to include an electronic package with a dual layered interposer, it is within the scope of this invention, instead to make the single layered embodiment shown in FIG. 3A. The invention is thus not limited to forming a structure having two dielectric layers used for the interposer.

Figure 8:
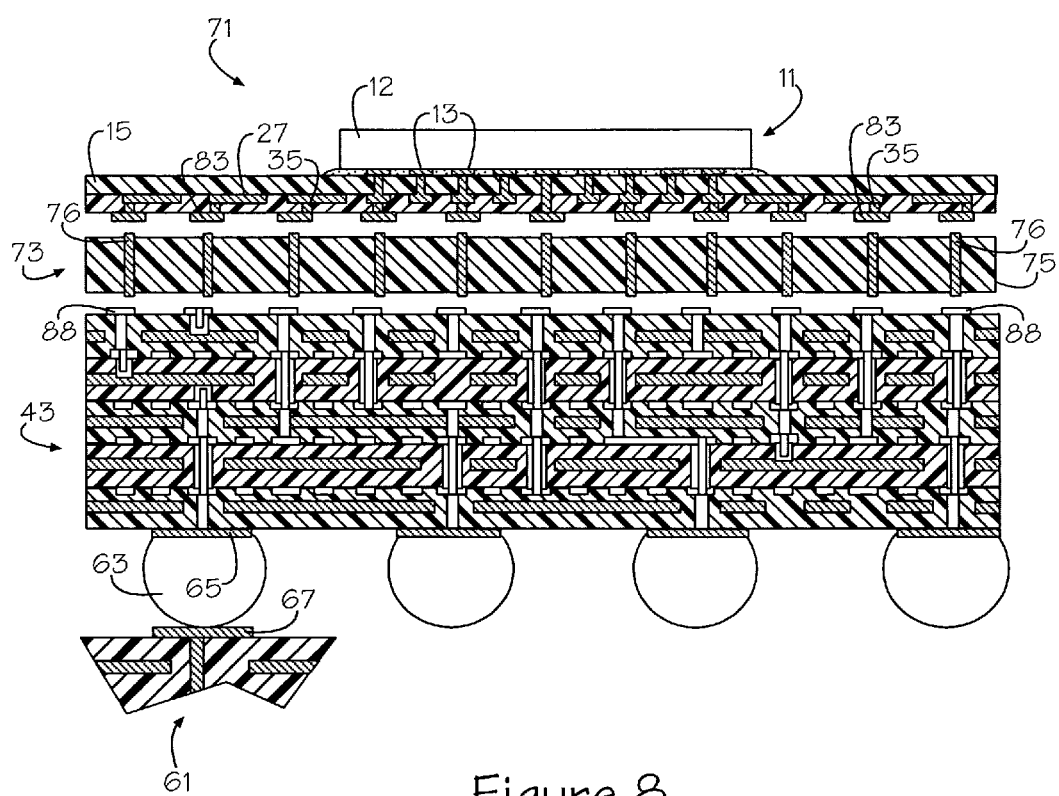
FIG. 8 is a side elevational view, on a reduced scale over FIGS. 1-3, illustrating a circuitized substrate assembly which may be formed in accordance with another embodiment of the invention, the assembly of FIG. 8 utilizing an interposer similar to that formed using the steps of FIGS. 1-3, 5 and 6 and a second interposer.

In FIG. 8, there is shown an assembly 71 made according to yet another embodiment of the invention. Assembly 71 is preferably similar to assembly 41, but a second interposer 73 is used to form the needed connections between the package interposer and hosting substrate 43. In one example, second interposer 73 may comprise a layered member 75 having therein one or more conductive layers (not shown, but understandably possibly similar to those of substrate 43 in FIG. 7), in addition to a plurality of thru-holes passing through the member and having conductive metallurgy 76 therein. The layers for member 75 are of dielectric material, preferably one or more of the materials defined hereinabove. One or more such layers are possible, and in the embodiment of FIG. 8, at least two such layers are used. If so, a single internal conductive layer is preferably copper or copper alloy and formed on one of the dielectric layers using conventional PCB circuit processing.

Formation of the openings through layered member 75 may be accomplished using the same laser ablation process defined above for the openings in layer 15 (and 31, if used). Added processing, e.g., plasma clean, are also used. Deposition of conductive metal 76 may also be accomplished using an electroplating operation similar to that above used to form conductors 25 and 27, and connecting lines 29. It is thus understood that using similar processing for this added member as used previously further reduces product overall costs. It is also possible to construct the second interposer such that no internal metal planes are used.

If the second interposer 73 is used, it is preferable to form a pattern of under conductors 83 atop the respective internal conductors 35, these conductors 83 thus of a similar low density pattern as the externally exposed conductors 35 shown in FIGS. 6 and 7. Similarly, the internal yet externally exposed conductors 76 are also of a similar, low density pattern. Conductors 83, wider than conductors 76, assure a sound connection between said conductors 83 and conductors 76 due to greater ease of alignment. Similar wider conductors 88 are formed on the upper surface of substrate 43 for this same reason. It is also within the scope of this invention to provide wider conductors on the opposite surfaces of layered member 75 in contact with conductors 76 for a similar reason, thus eliminating the wider conductors 83 and 88, or even retaining same to work in combination with such conductors.

The conductors 76 of interposer 73 may also comprise an electrically conductive adhesive that will form a metallurgical joint to conductors 83 and 88 of the upper and lower members, respectively. The conductive adhesive may be cured at elevated temperature, for example about 200 degrees C. during the process of joining the three members 71, 73 and 43.

Thus there has been shown and described new and unique methods for making interposer and electronic package assemblies which provide advantageous features over known such methods for making these packages and assemblies. The methods taught herein assure the provision of connections between both high density and less dense patterns of conductors to assure a sound, effective plurality of connections between a semiconductor chip or chips and a hosting much larger substrate such as a conventional PCB or chip carrier. These products are then adapted for use in large systems such as information handling systems. The invention assures formation of such precise connections, while enabling use of many less complex apparatus than might be previously considered necessary to make such products. Still further advantages are discernible from the other teachings herein.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A method of making an interposer for interconnecting a high density pattern of conductors of an electronic device and a less dense pattern of conductors on a circuitized substrate, said method comprising:

providing a single, thin dielectric layer including first and second opposing surfaces;

forming a high density pattern of conductors on said first surface of said single, thin dielectric layer adapted for engaging said high density pattern of conductors of said electronic device;

forming a high density pattern of openings within said single, thin dielectric layer, each of said openings aligned with and exposing a respective one of said conductors of said high density pattern of conductors on said first surface and extending through said single, thin dielectric layer to said second opposing layer;

forming a circuit pattern on said second opposing surface of said single, thin dielectric layer and including a first high density pattern of conductors similar to said high density pattern of conductors on said first surface and a second, less dense pattern of conductors adapted for being electrically coupled to said less dense pattern of conductors of said circuitized substrate;

forming a plurality of circuit lines interconnecting selected ones of said conductors of said high density pattern of conductors on said second opposing surface to selected ones of said conductors of said less dense pattern of conductors; and forming a plurality of conductive members within said high density pattern of openings within said single, thin dielectric layer to electrically interconnect selected ones of said high density pattern of conductors on said first surface to selected ones of said high density pattern of conductors on said second opposing surface.

2. The method of claim 1 wherein said forming of said high density pattern of conductors on said first surface of said single, thin dielectric layer is accomplished using a plating operation.

3. The method of claim 2 wherein said plating operation is selected from the group consisting of additive plating, subtractive plating and the like.

4. The method of claim 1 wherein said forming of said high density pattern of openings within said single, thin dielectric layer is accomplished using laser ablation.

5. The method of claim 1 wherein said forming of said circuit pattern on said second opposing surface of said single, thin dielectric layer and said second, less dense pattern of conductors is accomplished using a plating operation.

6. The method of claim 5 wherein said plating operation simultaneously forms said plurality of circuit lines interconnecting said selected ones of said conductors of said high density pattern of conductors on said second opposing surface to selected ones of said conductors of said less dense pattern of conductors.

7. The method of claim 6 wherein said plating operation for forming said circuit pattern on said second opposing surface of said single, thin dielectric layer and said plurality of circuit lines selected from the group consisting of additive plating, subtractive plating and the like.

8. The method of claim 1 wherein said forming of said plurality of conductive members within said high density pattern of openings within said single, thin dielectric layer to electrically interconnect selected ones of said high density pattern of conductors on said first surface to selected ones of said high density pattern of conductors on said second opposing surface is accomplished using a plating operation.

9. The method of claim 8 wherein said plating operation for forming said plurality of conductive members within said high density pattern of openings is selected from the group consisting of additive plating, subtractive plating and the like.

10. A method of making an interposer for interconnecting a high density pattern of conductors of an electronic device and a less dense pattern of conductors on a circuitized substrate, said method comprising:
 providing a first, thin dielectric layer including first and second opposing surfaces;
 forming a high density pattern of conductors on said first surface of said first, thin dielectric layer adapted for engaging said high density pattern of conductors of said electronic device;
 forming a high density pattern of openings within said first, thin dielectric layer, each of said openings aligned with and exposing a respective one of said conductors of said high density pattern of conductors on said first surface and extending through said first, thin dielectric layer to said second opposing layer;
 forming a circuit pattern on said second opposing surface of said first, thin dielectric layer and including a first high density pattern of conductors similar to said high density pattern of conductors on said first surface and a second, less dense pattern of conductors adapted for being electrically coupled to said less dense pattern of conductors of said circuitized substrate;
 forming a plurality of circuit lines interconnecting selected ones of said conductors of said high density pattern of conductors on said second opposing surface to selected ones of said conductors of said less dense pattern of conductors;
 forming a plurality of conductive members within said high density pattern of openings within said first, thin dielectric layer to electrically interconnect selected ones of said high density pattern of conductors on said first surface to selected ones of said high density pattern of conductors on said second opposing surface;
 bonding a second, thin dielectric layer to said second opposing surface of said first, thin dielectric layer so as to substantially cover said second, less dense pattern of conductors;
 forming a pattern of openings within said second, thin dielectric layer of a density substantially similar to said less dense pattern of conductors on said second opposing surface of said first, thin dielectric layer and extending through said second, thin dielectric layer to expose said less dense pattern of conductors on said second opposing surface; and
 forming a plurality of conductive members within said pattern of openings within said second, thin dielectric layer, said plurality of conductive members within said openings within said second, thin dielectric layer adapted for engaging said less dense pattern of conductors of said circuitized substrate to thereby interconnect said less dense pattern of conductors of said circuitized substrate to said less dense pattern of conductors on said second opposing surface of said first, thin dielectric layer.

11. The method of claim 10 wherein said forming of said pattern of openings within said second, thin dielectric layer is accomplished using laser ablation.

12. The method of claim 10 wherein said forming of said plurality of conductive members within said pattern of openings within said second, thin dielectric layer is accomplished using a plating operation.

13. A method of making an electronic package, said method comprising:
 providing an electronic device including a high density pattern of conductors;
 providing a single, thin dielectric layer including first and second opposing surfaces;
 forming a high density pattern of conductors on said first surface of said single, thin dielectric layer adapted for engaging said high density pattern of conductors of said electronic device;
 electrically coupling said high density pattern of conductors on said first surface of said single, thin dielectric layer to said high density pattern of conductors of said electronic device;
 forming a high density pattern of openings within said single, thin dielectric layer, each of said openings aligned with and exposing a respective one of said conductors of said high density pattern of conductors on said first surface and extending through said single, thin dielectric layer to said second opposing layer;
 forming a circuit pattern on said second opposing surface of said single, thin dielectric layer and including a first high density pattern of conductors similar to said high density pattern of conductors on said first surface and a second, less dense pattern of conductors adapted for being electrically coupled to a less dense pattern of conductors of a circuitized substrate;
 forming a plurality of circuit lines interconnecting selected ones of said conductors of said high density pattern of conductors on said second opposing surface to selected ones of said conductors of said less dense pattern of conductors; and
 forming a plurality of conductive members within said high density pattern of openings within said single, thin dielectric layer to electrically interconnect selected ones of said high density pattern of conductors on said first surface to selected ones of said high density pattern of conductors on said second opposing surface.

14. The method of claim 13 wherein said electrically coupling of said high density pattern of conductors on said first surface of said single, thin dielectric layer to said high density pattern of conductors of said electronic device is accomplished using solder paste.

15. The method of claim 13 wherein said electrically coupling of said high density pattern of conductors on said first surface of said single, thin dielectric layer to said high density pattern of conductors of said electronic device is accomplished using solder balls.

16. The method of claim 13 wherein said electrically coupling of said high density pattern of conductors on said first surface of said single, thin dielectric layer to said high density pattern of conductors of said electronic device is accomplished using electrically conductive paste.

17. A method of making an electronic package, said method comprising:
 providing an electronic device including a high density pattern of conductors;

providing a first, thin dielectric layer including first and second opposing surfaces;

forming a high density pattern of conductors on said first surface of said first, thin dielectric layer adapted for engaging said high density pattern of conductors of said electronic device;

electrically coupling said high density pattern of conductors on said first surface of said first, thin dielectric layer to said high density pattern of conductors of said electronic device;

forming a high density pattern of openings within said first, thin dielectric layer, each of said openings aligned with and exposing a respective one of said conductors of said high density pattern of conductors on said first surface and extending through said first, thin dielectric layer to said second opposing layer;

forming a circuit pattern on said second opposing surface of said first, thin dielectric layer and including a first high density pattern of conductors similar to said high density pattern of conductors on said first surface and a second, less dense pattern of conductors adapted for being electrically coupled to a less dense pattern of conductors of a circuitized substrate;

forming a plurality of circuit lines interconnecting selected ones of said conductors of said high density pattern of conductors on said second opposing surface to selected ones of said conductors of said less dense pattern of conductors;

forming a plurality of conductive members within said high density pattern of openings within said first, thin dielectric layer to electrically interconnect selected ones of said high density pattern of conductors on said first surface to selected ones of said high density pattern of conductors on said second opposing surface;

bonding a second, thin dielectric layer to said second opposing surface of said first, thin dielectric layer so as to substantially cover said second, less dense pattern of conductors;

forming a pattern of openings within said second, thin dielectric layer of a density substantially similar to said less dense pattern of conductors on said second opposing surface of said first, thin dielectric layer and extending through said second, thin dielectric layer to expose said less dense pattern of conductors on said second opposing surface; and forming a plurality of conductive members within said pattern of openings within said second, thin dielectric layer, said plurality of conductive members within said openings within said second, thin dielectric layer adapted for engaging said less dense pattern of conductors of said circuitized substrate to thereby interconnect said less dense pattern of conductors of said circuitized substrate to said less dense pattern of conductors on said second opposing surface of said first, thin dielectric layer.

18. The method of claim 17 wherein said electrically coupling of said high density pattern of conductors on said first surface of said single, thin dielectric layer to said high density pattern of conductors of said electronic device is accomplished using solder paste.

19. The method of claim 17 wherein said electrically coupling of said high density pattern of conductors on said first surface of said single, thin dielectric layer to said high density pattern of conductors of said electronic device is accomplished using solder balls.

20. The method of claim 17 wherein said electrically coupling of said high density pattern of conductors on said first surface of said single, thin dielectric layer to said high density pattern of conductors of said electronic device is accomplished using electrically conductive paste.

* * * * *